United States Patent
Dupras et al.

(10) Patent No.: US 12,061,848 B2
(45) Date of Patent: Aug. 13, 2024

(54) METHOD AND SYSTEM FOR SIMULATING AND IMPLEMENTING HORTICULTURAL LIGHTING SCENARIOS

(71) Applicant: SOLLUM TECHNOLOGIES INC., Montreal (CA)

(72) Inventors: Gabriel Dupras, Montreal (CA); Francois Roy-Moisan, Montreal (CA); Jacques Poirier, Montreal (CA); Guillaume Tourville, Montreal (CA); Patrick Menard, Montreal (CA); Leandre Arseneault, Montreal (CA); Marc Tremblay, Montreal (CA)

(73) Assignee: Sollum Technologies Inc., Quebec (CA)

( * ) Notice: Subject to any disclaimer, the term of this patent is extended or adjusted under 35 U.S.C. 154(b) by 158 days.

(21) Appl. No.: 17/674,265

(22) Filed: Feb. 17, 2022

(65) Prior Publication Data

US 2022/0256776 A1 Aug. 18, 2022

Related U.S. Application Data

(60) Provisional application No. 63/200,700, filed on Mar. 23, 2021, provisional application No. 63/150,438, filed on Feb. 17, 2021.

(51) Int. Cl.
*G06F 30/20* (2020.01)
*H05B 47/105* (2020.01)

(52) U.S. Cl.
CPC ........... *G06F 30/20* (2020.01); *H05B 47/105* (2020.01)

(58) Field of Classification Search
None
See application file for complete search history.

(56) References Cited

U.S. PATENT DOCUMENTS

2015/0089866 A1   4/2015  Abbott et al.
2015/0245595 A1*  9/2015  Muller ............... A01K 29/005
                                                        700/90

(Continued)

FOREIGN PATENT DOCUMENTS

EP    3561744 A1    10/2019
KR    20200104255 A  9/2020

(Continued)

OTHER PUBLICATIONS

Extended European Search Report in European Application No. 22157349.6, dated Dec. 7, 2022, 11 pages.

(Continued)

*Primary Examiner* — Wilson Lee
(74) *Attorney, Agent, or Firm* — Jason M. Shapiro; Devlin Law Firm LLC

(57) ABSTRACT

A system for simulating and implementing lighting scenarios for driving a horticultural light source in accordance with illumination instructions. The system comprises: an input module receiving simulation parameters; a graphical user interface for selecting, creating, editing, re-ordering, duplicating and/or replicating a virtual lighting scenario; a lamp profile acquisition module acquiring a reference profile of the light source and generating virtual illumination instructions for the virtual lighting scenario; a scenario simulation module simulating the execution of the virtual lighting scenario, for the horticultural light source, in accordance with the simulation parameters and for a specific time period and generating therefrom simulation results including integral indicators displayable on the graphical user interface; and an output module receiving a designated lighting scenario selected based on the simulation results and outputting the illumination instructions representative of the (Continued)

designated scenario. A method for simulating and implementing lighting scenarios is also provided.

20 Claims, 3 Drawing Sheets

(56) References Cited

U.S. PATENT DOCUMENTS

| | | | |
|---|---|---|---|
| 2016/0184237 A1* | 6/2016 | Lowe | A61K 31/05 |
| | | | 47/58.1 LS |
| 2016/0232621 A1* | 8/2016 | Ethington | G06Q 50/02 |
| 2017/0345208 A1* | 11/2017 | Ashdown | H05B 47/11 |
| 2019/0114376 A1 | 4/2019 | Ashdown et al. | |
| 2019/0259108 A1 | 8/2019 | Bongartz et al. | |
| 2022/0015210 A1* | 1/2022 | Dupras | H05B 47/155 |
| 2022/0256775 A1 | 8/2022 | Poirier et al. | |

FOREIGN PATENT DOCUMENTS

| | | |
|---|---|---|
| WO | 2013111134 A1 | 8/2013 |
| WO | 2016/119063 A1 | 8/2016 |
| WO | 2018231506 A1 | 12/2018 |

OTHER PUBLICATIONS

Extended European Search Report in European Application No. 22157330.6, dated Jun. 23, 2022, 10 pages.

* cited by examiner

METHOD AND SYSTEM FOR SIMULATING AND IMPLEMENTING HORTICULTURAL LIGHTING SCENARIOS

CROSS-REFERENCE TO RELATED APPLICATIONS

This application claims priority under 35 USC § 119(e) of U.S. provisional patent applications 63/150,438, filed on Feb. 17, 2021 and 63/200,700, filed on Mar. 23, 2021, the specifications of which being hereby incorporated by reference.

TECHNICAL FIELD OF THE INVENTION

The technical field generally relates to lighting, and more particularly concerns methods and systems for simulating and implementing horticultural lighting scenarios specifically designed for controlling horticultural light illuminating a crop or plant.

BACKGROUND

Artificial light sources can be used in horticulture or agriculture to assist or promote the growth of plants or crops.

However, it remains a challenge to select and implement appropriate or optimized horticultural lighting scenarios for controlling the horticultural light illuminating a crop or plant, in accordance with the lighting requirements of a growing plant or crop, without being able to measure the resulting parameters or measurable factors associated with the operation, characterization or control of the horticultural light during the execution of the specific horticultural lighting scenarios. Such resulting parameters or measurable factors can, for example, impact the growth of the crops or plant and/or the profitability of a specific culture, therefore making a lighting scenario more appropriate than another one.

In such conditions, horticultural lighting scenarios can be developed and physically implemented to measure the resulting parameters or measurable factors associated with the operation, characterization or control of the horticultural light during the execution of the specific horticultural lighting scenarios and a subsequent selection of the horticultural lighting scenarios which are most adapted or optimized for specific crops/plants, contexts, environments and/or parameters can be performed. Such a procedure however suffers from several drawbacks, at least from an energy and time consumption standpoint.

In view of the above, there is a need for an improved system and method for simulating and implementing horticultural lighting scenarios which would be able to overcome or at least minimize some of the above-discussed prior art concerns.

SUMMARY OF THE INVENTION

In accordance with a first general aspect, there is provided a system for simulating and implementing horticultural lighting scenarios for driving a horticultural light source in accordance with illumination instructions. The system comprises: an input module receiving simulation parameters; a graphical user interface configured to allow at least one of selecting, creating, editing, re-ordering, duplicating and replicating at least one virtual lighting scenario being a virtual representation of a horticultural lighting scenario; a lamp profile acquisition module acquiring a reference profile of the horticultural light source, the lamp profile acquisition module being further configured to generate virtual illumination instructions of the horticultural light source for the at least one virtual lighting scenario; a scenario simulation module simulating the execution of the at least one virtual lighting scenario, for the horticultural light source, in accordance with the simulation parameters and for a specific time period, the scenario simulation module being configured to simulate the execution of the virtual illumination instructions representative of the at least one virtual lighting scenario for the specific time period and to generate therefrom simulation results including instantaneous indicators and being displayable on the graphical user interface; and an output module receiving the horticultural lighting scenario corresponding to one of the at least one lighting scenario selected based on the simulation results and outputting the illumination instructions representative of the one of the at least one lighting scenario.

In an embodiment, the reference profile of the horticultural light source includes sets of reference control parameters of the horticultural light source for producing reference illumination states each associated to a corresponding one of a plurality of lighting reference points of the horticultural lighting scenario.

In an embodiment, the scenario simulation module is configured to perform one of determination and estimation of the integral indicators resulting from the execution of the virtual illumination instructions on the horticultural light source.

In an embodiment, the scenario simulation module is configured to perform the one of the determination and estimation of the integral indicators by computing a plurality of successive instantaneous indicators for the virtual illumination instructions representative of the virtual lighting scenario specific simulation parameters and subsequently collecting the plurality of successive estimated instantaneous indicators.

In an embodiment the scenario simulation module is configured to perform computing of the plurality of successive instantaneous indicators using at least one lamp modelling method.

In an embodiment, the scenario simulation module is configured to collect the plurality of instantaneous indicators in a time series database or as aggregates.

In an embodiment, the scenario simulation module is configured to receive data relative to additional integral indicators from an integral indicator plugin framework defining new integral indicators to be determined or estimated by the scenario simulation module during a simulation.

In an embodiment, the scenario simulation module is configured to transmit the simulation results to the graphical user interface and the graphical user interface is configured to display the simulation results thereon, the graphical user interface being further configured to provide input defining a selection relative to the selected horticultural lighting scenario, based on the simulation results being displayed on the graphical user interface and to transmit the selected horticultural lighting scenario in accordance with the selection to the output module.

In an embodiment, the system further comprises the horticultural light source being configured to be driven according to the horticultural lighting scenario corresponding to one of the at least one lighting scenario selected based on the simulation results.

In accordance with another general aspect, there is provided a method for simulating and implementing horticultural lighting scenarios for driving a horticultural light source in accordance with illumination instructions. The method comprises the steps of: receiving simulation parameters inputs; receiving at least one virtual lighting scenario being a virtual representation of a horticultural lighting scenario; acquiring a reference profile for the horticultural light source and determining virtual illumination instructions of the horticultural light source, for the at least one virtual lighting scenarios; simulating the execution of the at least one virtual lighting scenario, for the horticultural light source, in accordance with the simulation parameters and for a specific time period, the simulation being performed by simulating the execution of the virtual illumination instructions representative of the at least one virtual lighting scenarios for the specific time period and generating therefrom simulation results including instantaneous indicators; displaying the simulation results from the simulation of the execution of the at least one virtual lighting scenario on a graphical user interface and receiving a designated horticultural lighting scenario selected from the at least one virtual lighting scenarios, based on the simulation results; and outputting illumination instructions representative of the designated horticultural lighting scenario.

In an embodiment, the step of acquiring the reference profile for the horticultural light source includes acquiring sets of reference control parameters of the horticultural light source for producing reference illumination states each associated to a corresponding one of a plurality of lighting reference points of the horticultural lighting scenario.

In an embodiment, the step of simulating the execution of the at least one virtual lighting scenario includes performing one of determination and estimation of the integral indicators resulting from the execution of the virtual illumination instructions on the horticultural light source.

In an embodiment, performing the one of the determination and estimation of the integral indicators includes computing a plurality of successive instantaneous indicators for the virtual illumination instructions representative of the virtual lighting scenario specific simulation parameters and subsequently collecting the plurality of successive estimated instantaneous indicators.

In an embodiment, computing of the plurality of successive instantaneous indicators includes computing the plurality of successive instantaneous indicators using at least one lamp modelling method.

In an embodiment, collecting the plurality of successive estimated instantaneous indicators includes collecting the plurality of successive estimated instantaneous indicators in a time series database or as aggregates.

In an embodiment, the method further comprises the step of receiving data relative to additional integral indicators from an integral indicator plugin framework defining new integral indicators to be determined or estimated during a simulation.

In an embodiment, the method further comprises the steps of: transmitting the simulation results to the graphical user interface prior to the display of the simulation results thereon; and receiving input from the graphical user interface defining the designated horticultural lighting scenario selected from the at least one virtual lighting scenarios, based on the simulation results In an embodiment, the step of receiving the least one virtual lighting scenario includes one of receiving a preprogrammed lighting scenario from a lighting scenario data source and receiving from the user interface a virtual lighting scenario created, edited, re-ordered, duplicated or replicated using the graphical user interface.

In an embodiment, the method further comprises the step of driving the horticultural light source according to the selected lighting scenario.

In accordance with another general aspect, there is provided a non-transitory computer readable storage medium having stored thereon computer executable instructions that, when executed by a processor, cause the processor to perform the steps of the method defined above.

BRIEF DESCRIPTION OF THE DRAWINGS

Other objects, advantages and features will become more apparent upon reading the following non-restrictive description of embodiments thereof, given for the purpose of exemplification only, with reference to the accompanying drawings in which.

DETAILED DESCRIPTION

Figure 1:
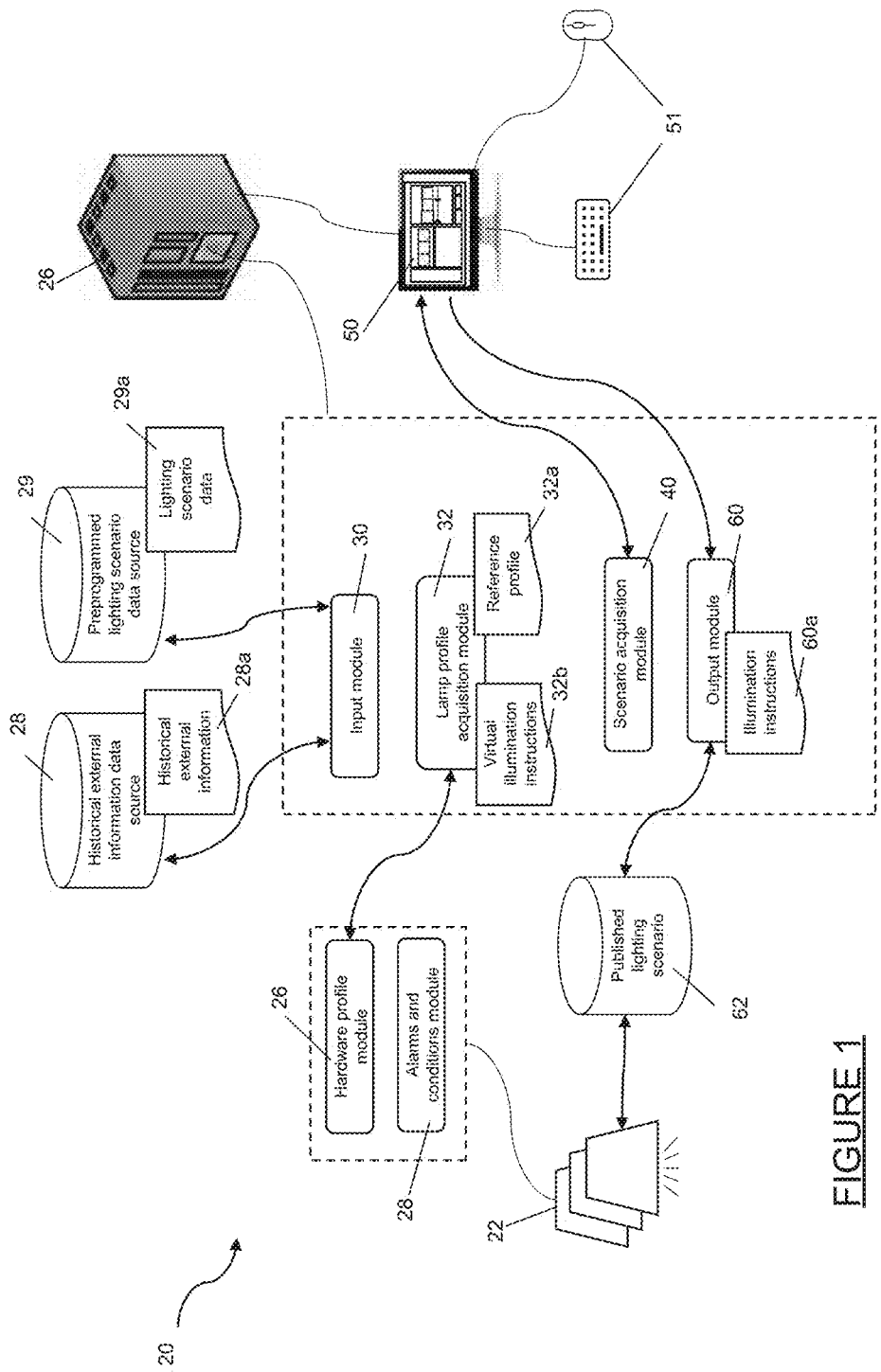
FIG. 1 is a schematic representation of the system for simulating and implementing horticultural lighting scenarios, in accordance with an embodiment.

In the present description, similar features in the drawings have been given similar reference numerals. To avoid cluttering certain figures, some elements may not have been indicated if they were already identified in a preceding figure. It should also be understood that the elements of the drawings are not necessarily depicted to scale, since emphasis is placed on clearly illustrating the elements and structures of the present embodiments. Furthermore, positional descriptors indicating the location and/or orientation of one element with respect to another element are used herein for ease and clarity of description. Unless otherwise indicated, these positional descriptors should be taken in the context of the figures and should not be considered limiting. More particularly, it will be understood that such spatially relative terms are intended to encompass different orientations in the use or operation of the present embodiments, in addition to the orientations exemplified in the figures.

Moreover, although the embodiments of the system and corresponding parts thereof consist of certain components and configurations as explained and illustrated herein, not all of these components and configurations are essential and thus should not be taken in their restrictive sense. It is to be understood, as also apparent to a person skilled in the art, that other suitable components and cooperation thereinbetween, can be used for the system, as will be briefly explained herein and as can be easily inferred herefrom by a person skilled in the art.

Moreover, although the associated method includes steps as explained and illustrated herein, not all of these steps are essential and thus should not be taken in their restrictive sense. It will be appreciated that the steps of the method described herein can be performed in the described order, or in any suitable order. In an embodiment steps of the proposed method are implemented as software instructions and algorithms, stored in computer memory and executed by processors. It should be understood that servers and computers are therefore required to implement to proposed system, and to execute the proposed method. In other words, the skilled reader will readily recognize that steps of various above-described methods can be performed by programmed computers. In view of the above, some embodiments are also intended to cover program storage devices (e.g. digital data storage media), which are machine or computer readable and encode machine-executable or computer-executable programs or instructions, wherein said instructions perform some or all of the steps of said above-described methods. The embodiments are also intended to cover computers programmed to perform said steps of the above-described methods.

It should be appreciated by those skilled in the art that any block diagrams herein represent conceptual views of illustrative circuitry embodying the principles disclosed herein. Similarly, it will be appreciated that any flow charts and transmission diagrams, and the like, represent various processes which can be substantially represented in computer readable medium and so executed by a computer or processor, whether or not such computer or processor is explicitly shown.

The terms "a", "an" and "one" are defined herein to mean "at least one", that is, these terms do not exclude a plural number of items, unless stated otherwise.

Terms such as "substantially", "generally" and "about", that modify a value, condition or characteristic of a feature of an exemplary embodiment, should be understood to mean that the value, condition or characteristic is defined within tolerances that are acceptable for the proper operation of this exemplary embodiment for its intended application.

Unless stated otherwise, the terms "connected" and "coupled", and derivatives and variants thereof, refer herein to any structural or functional connection or coupling, either direct or indirect, between two or more elements. For example, the connection or coupling between the elements can be acoustical, mechanical, optical, electrical, thermal, logical, or any combinations thereof.

The terms "match", "matching" and "matched" are intended to refer herein to a condition in which two elements are either the same or within some predetermined tolerance of each other. That is, these terms are meant to encompass not only "exactly" or "identically" matching the two elements but also "substantially", "approximately" or "subjectively" matching the two elements, as well as providing a higher or best match among a plurality of matching possibilities.

In the present description, the expression "based on" is intended to mean "based at least partly on", that is, this expression can mean "based solely on" or "based partially on", and so should not be interpreted in a limited manner. More particularly, the expression "based on" could also be understood as meaning "depending on", "representative of", "indicative of", "associated with" or similar expressions.

The term "computing device" is used to encompass computers, servers and/or specialized electronic devices which receive, process and/or transmit data. Computing devices are generally part of "systems" and include processing means, such as microcontrollers and/or microprocessors, CPUs or are implemented on FPGAs, as examples only. The processing means are used in combination with storage medium, also referred to as "memory" or "storage means". Storage medium can store instructions, algorithms, rules and/or data to be processed. Storage medium encompasses volatile or non-volatile/persistent memory, such as registers, cache, RAM, flash memory, ROM, as examples only. The type of memory is, of course, chosen according to the desired use, whether it should retain instructions, or temporarily store, retain or update data.

One skilled in the art will therefore understand that each such computing device typically includes a processor (or multiple processors) that executes program instructions stored in the memory or other non-transitory computer-readable storage medium or device (e.g. solid state storage devices, disk drives, etc.). The various functions, modules, services, units or the like disclosed hereinbelow can be embodied in such program instructions, and/or can be implemented in application-specific circuitry (e.g. ASICs or FPGAs) of the computers. Where a computer system includes multiple computing devices these devices can, but need not, be co-located. In some embodiments, a computer system can be a cloud-based computing system whose processing resources are shared by multiple distinct business entities or other users.

It should be noted that, in the context of the current disclosure, the expression "plants or crops" may encompass a broad variety of multicellular organisms, including photosynthetic eukaryotes. Non limitative examples of plants or crops are seedlings, ornamental crops, ornamental plants, plugs, liners, fruits, small fruits, vegetables, leafy greens, herbs, young plants, high-value crops, and many others. The plants or crops may be produced for human food, non-human food or non-food applications. The growing process of the plants or crops generally includes a plurality of subsequent plant growth stages, such as, for example, seed germination (or "sprout"), seedling, vegetative, bud stage (or "budding"), flowering and ripening. It should be understood that, in the present description, the plants or crops can be at any one of the plant growth stages or at a transition between any two subsequent growth stages.

The expression "horticultural light", synonyms and derivatives thereof will be used throughout the present disclosure, and refers to the use of optical techniques, systems, and methods for assisting, maintaining, stimulating and/or optimizing plants or crops growth. The horticultural light may irradiate or illuminate the plants or crops during any one of the plant growth stages. The horticultural light, which is the light generated by the horticultural lighting apparatus, may be produced or generated using an artificial light source or similar devices, apparatuses, and systems. Non-limiting examples of artificial light sources include incandescent light sources, fluorescent light sources, high-intensity discharge (HID) light sources such as mercury vapor, metal halide (MH), high-pressure sodium (HPS) and low-pressure sodium (LPS) light sources, solid-state light sources including LED light sources, and laser sources. The horticultural light is associated with an illumination spectrum or profile. In some implementations, the horticultural light produced by the horticultural lighting apparatus has a profile substantially similar to light reaching the crop or plant.

The expression "illumination spectrum" is used to broadly refer to the spectral power distribution of an illumination. The illumination spectrum can represent the distribution of power radiated per unit area and per unit wavelength or frequency over a spectral region of the electromagnetic spectrum. It should be noted that using horticultural light may be used to irradiate or illuminate plants or crops growing in a horticultural structure providing regulated climatic conditions to the plants or crops. Nonlimitative examples of horticultural structures include greenhouse, glasshouse and hothouse.

In the present description, the terms "light" and "optical", and variants and derivatives thereof, are used to refer to radiation in any appropriate region of the electromagnetic spectrum. The terms "light" and "optical" are therefore not limited to visible light, but can also include, without being limited to, the infrared and ultraviolet regions. For example, in some implementations, the present techniques can be used with electromagnetic signals having wavelengths ranging from about 250 nm to about 2500 nm. However, this range is provided for illustrative purposes only and some implementations of the present techniques may operate outside this range. Also, the skilled person will appreciate that the definition of the ultraviolet, visible and infrared ranges in terms of spectral ranges, as well as the dividing lines between them, can vary depending on the technical field or the definitions under consideration, and are not meant to limit the scope of applications of the present techniques.

The expressions "natural light" or "natural light conditions" generally refer to light having spectral characteristics corresponding or similar to those of sunlight, moonlight or starlight. The spectral profile of natural light, particularly sunlight, varies as a function of geographic location, time of day, time of year, weather, cloud coverage, and several other factors. Several standards are known in the art to provide a spectral reference for natural light. For example, the Commission internationale de l'eclairage (CIE) has established the D series of well-defined daylight standard illuminants representing natural light under different conditions. One well-known standard is CIE Standard Illuminant D65, which is a daylight illuminant that intends to represent the average midday light in Western or Northern Europe. Other examples of CIE Standard Illuminants for daylight include the D50, D55, and D75 standard illuminants. Sunlight, which refers to the total spectrum of electromagnetic radiation emitted by the Sun and reaching the Earth, has a broad spectral range including ultraviolet radiation, visible light, and infrared radiation. Accordingly, standard illuminants extend within the solar radiation spectrum. For example, Standard Illuminant D65 extends from 300 nm to 830 nm. Non-limiting examples of natural light sources include sunlight, moonlight, starlight, twilight, lightning, and firelight.

In the present description, the term "solid-state light emitter" refers to any light-emitting device that converts electrical energy into electromagnetic radiation through the recombination of electronic carriers (i.e., electrons and holes) in a light emitting layer or region. The emitting layer or region can include, but is not limited to, silicon, silicon carbide, gallium nitride and/or other semiconductor materials, and may or may not include a substrate such as sapphire, silicon, silicon carbide and/or other microelectronic substrates. The solid-state light emitters can include both inorganic and organic light emitters, many of which are known to the skilled person and need not be described in detail herein. Non-limiting examples of types of solid-state light emitters include semiconductor light-emitting diodes (LEDs), semiconductor laser diodes, vertical cavity surface emitting lasers (VCSELs), other semiconductor light emitting devices or lamps, organic light-emitting diodes (OLEDs), and polymer light-emitting diode (PLEDs).

The expression "lighting scenario" is understood to refer to the generation of light, such as for illuminating purposes, according to predetermined optical characteristics (e.g. spectral content, intensity, polarization) that vary or evolve over time during a given time period. The optical characteristics of the generated light may correspond to or emulate those of natural lighting conditions. The natural light may emulate or be inspired from the actual light conditions experienced at a specific geographical location, date and time. It is appreciated that devising lighting scenarios that combine natural light conditions corresponding to different geographical locations is possible in some applications (e.g. a scenario could be build using sunrise, midday and sunset conditions corresponding to three distinct locations on Earth, at the same or different dates). In other embodiments, however, the natural light conditions may be different from real life conditions on Earth. By way of example, the spectrum of natural light generated according to the method described herein may differ from an actual spectral content of sunlight due to the absence of spectral components which are undesired or unnecessary in a given application context, or conversely by the enhancement or addition of wavelengths then are considered advantageous or required. The present techniques may rely on the use of solid-state light emitters. The solid-state light emitters can be driven to produce the lighting scenario using sets of control parameters. It should be noted that a plurality of lighting scenarios may be combined to collectively determine a "recipe" or a "recipe bundle". The recipe or the recipe bundle refers to a sequence of lighting scenarios.

In some embodiments, the lighting scenario may emulate lighting conditions over the course of a day, from dawn to dusk, or over a portion of a day. Indeed, the spectral contents of light reaching a particular location on earth from the Sun is not constant as the day progress. In some instances, it can be customary to characterize natural light according to its Correlated Color Temperature (CCT) value, expressed in Kelvin (K). By convention, the CCT is defined by the CIE as "the temperature of the Planckian radiator whose perceived color most closely resembles that of a given stimulus at the same brightness and under specified viewing conditions" (CIE/IEC 17.4:1987, International Lighting Vocabulary). Lower CCT values correspond to "warmer" light. Hence, a day with a clear blue sky can begin at dawn with light in a warm CCT spectrum range, such as between 1500K and 3000K, then progress to about 5000K to 7500K at mid-day and return to the 1500K to 3000K range towards dusk. In horticultural or agricultural applications, the light conditions in a region of the world from which a cultivated produce originates or where this produce is known to thrive can be emulated (e.g. growing tomatoes using light conditions from a sunny day in June in Tuscany). In other examples, the lighting conditions may be adapted in view of observations or discoveries regarding optimal or enhanced lighting conditions for growing a given agricultural output, such as for example to follow the McCree Curve, which represents the average photosynthetic response of plants to light energy.

The present description generally relates to methods and systems for simulating and implementing horticultural lighting scenarios meeting desired lighting requirements, for subsequent implementation of one of the scenarios on a horticultural light source. Broadly described, the techniques herein disclosed includes simulating the execution of a virtual lighting scenario to determine or estimate integral indicators thereof, over a specified time period and for specific simulation parameters, in order to perform a selection of at least one lighting scenario to be executed on a horticultural light source.

In the context of the current disclosure, the expression "integral indicators" will be used to refer to any parameters or measurable factors representative of the horticultural light, or that may be associated with the operation, characterization or control of the horticultural light. The integral indicators may be indicative of a target, e.g., a value of a given parameter to be reached at the end of an illumination cycle, photoperiod, or sequence. Nonlimitative examples of integral indicators are:

light integral to determine the photosynthetic photon flux (PPF) or the photosynthetic photon flux density (PPFD);

light integral to determine the PPFD or the PFD associated with each wavelength;

the CCT integral (measured in Kelvins);

integral to determine the relative intensity (expressed in relative %) associated with each wavelength;

the integral to determine the power consumption (expressed in kW) associated with each wavelength;

the integral to determine the relative intensity (expressed in relative %) associated with each LED;

the integral to determine the power consumption (expressed in kW) associated with each LED;

the power consumption integral (expressed in kW); and the daily light integral (DLI) determining the number of photosynthetically active photons accumulated in a square meter over a 24-hour period (expressed in $mol \cdot m^{-2} \cdot d^{-}$).

As it will be understood from the above examples, the integral indicators assign numbers to functions in a way that describes dimensions or parameters of interest that may arise by combining instantaneous values of a given dimension or parameter over a given period or sub-period.

In the present description, the expression "external information" will be used to refer to data that may influence the horticultural light or its control, while not necessarily being representative of the horticultural light. Non limitative examples of external information are the weather, the grid rate schedule, data generated, produced or obtained with the sensors being used in the horticultural structure, the zone(s) of the horticultural structure, the power consumption of the lighting source(s), and data associated with plug-in API. In some embodiments, the external information may include growth parameters of the crops or plants. Examples of growth parameters include, but are not limited to absolute growth rate, relative growth rate, dimensions of the crops of plants or a portion thereof (e.g. roots, stems, leaves, buds, flowers, fruits, nodes, internodes and the like), and any other parameters related to the growth of the crops or plants.

System for Simulating and Implementing Horticultural Lighting Scenarios

Referring to FIG. 1, there is provided a system 20 for simulating and implementing horticultural lighting scenarios used for driving a horticultural light source in accordance with illumination instructions and therefore illuminating crops or plants, in accordance with an embodiment. In general terms and as will be described in more details below, the system 20 is designed to manage and execute one or more simulation of virtual lighting scenarios over a given time period, based on specific simulation parameters, thereby allowing subsequent selection of one or more lighting scenarios which are adapted or optimized for specific crops/plants, contexts, environments and/or parameters. It will be understood that even though the system is described herein in connection with a lighting scenario, the system can be adapted to manage and execute virtual simulations of one or more scenarios, recipes, recipe bundles, or any types of lighting sequence.

One skilled in the art will understand that the term "virtual lighting scenario" is used herein to define a virtual representation of a horticultural lighting scenario used for driving a horticultural light source in accordance with illumination instructions.

In accordance with the embodiment shown in FIG. 1, the system 20 broadly includes one or more computing devices 26 and data storage such as databases, repositories, data stores, etc. In an embodiment the system 20 can further include a horticultural light source 22 receiving illumination instructions relative to a lighting scenario as input(s) and illuminating the plants or crops in accordance with a corresponding lighting scenario. Alternatively, the system 20 can be provided upstream of the horticultural light source 22, such that the illumination instructions relative to the lighting scenario can be used as output of the system 20 and be received as input by the horticultural light source 22.

In some embodiments, the horticultural light source 22 can be a lamp similar to the lighting system described in international patent application WO 2016119063, the content of which being incorporated herein by reference. One skilled in the art will understand that even though a single horticultural light source 22 is discussed in the present description and illustrated in FIG. 1, in an embodiment, a plurality of horticultural light sources 22 could be used. For instance, the proposed system 20 can be used to control the horticultural light generated or produced by a plurality of lamps. Of note, the lamps can be simultaneously, sequentially or concurrently controlled, in accordance with the corresponding lighting scenario, depending on the target applications.

In an embodiment, the horticultural light source 22 can include temperature sensors (not shown) embedded therein. Each one of the temperature sensors can be monitored at any time, in run-time or not. In an embodiment, at least one temperature sensor is configured and positioned to monitor the internal CPU temperature of the CPU of the horticultural light source 22 and at least one temperature sensor is configured and positioned to monitor other critical parts of the horticultural light source 22.

In an embodiment, the horticultural light source 22 includes an alarms and conditions module 28 configured to receive the data from the temperature sensors and to determine when an overheating condition is detected. Upon detection of an occurrence of an overheating condition, the alarms and conditions module 28 is configured to adjusts parameters of operation of at least one component of the horticultural light source 22, in order to resolve the overheating condition.

In an embodiment, the data storage of the system 20 includes a historical external information data source 28 and a preprogrammed lighting scenario data source 29. The system 20 also includes an input module 30, a lamp profile acquisition module 32, a scenario simulation module 40, a graphical user interface 50 and an output module 60. One skilled in the art will understand that, in an embodiment (not shown), the historical external information data source 28 and the preprogrammed lighting scenario data source 29 can be hosted on the same storage device or on different storage devices. In an embodiment (not shown), the historical external information data source 28 and the preprogrammed lighting scenario data source 29 could be embodied in a single data source containing the combined data thereof.

As can be appreciated, one skilled in the art will understand that the above-mentioned modules can be implemented via programmable computer components, such as one or more physical or virtual computers comprising a processor and memory. It is appreciated, however, that other configurations are also possible.

Moreover, the modules, data sources and other components of the system described herein can be in data communication through direct communication such as a wired connection or via a network allowing data communication between computing devices or components of a network capable of receiving or sending data, which includes publicly accessible networks of linked networks, possibly operated by various distinct parties, such as the Internet, private networks (PN), personal area networks (PAN), local area networks (LAN), wide area networks (WAN), cable networks, satellite networks, cellular telephone networks, etc. or combination thereof.

The input module 20 is configured to receive or acquire simulation parameters from corresponding data sources. In an embodiment the simulation parameters can be representative of a past illumination sequence of a crop or plant. In an embodiment, the simulation parameters can include historical external information 28a received or acquired from the historical data source 28. The input module 20 can also acquire or receive lighting scenario data 29a relative to preprogrammed lighting scenarios from the preprogrammed lighting scenario data source 29. In an embodiment, the historical external information 28a can include, for example and without being limitative, historical weather datasets including weather information over a time period which can be used for the simulation (or data regarding the available historical weather datasets for a selection of a specific dataset), historical sensor datasets including environmental information (e.g. temperature, humidity, lighting, $CO_2$, etc.) obtained from sensors over a time period which can be used for the simulation (or data regarding the available historical sensor datasets for a selection of a specific dataset), an historical grid rates schedule pattern dataset including grid rates over a time period which can be used for the simulation (or data regarding the available historical grid rates schedule pattern datasets for a selection of a specific dataset), or the like.

In some embodiments, the lighting scenarios (or recipes) data 29a acquired by the input module 20 includes data defining the optical characteristics (e.g. spectral content, intensity, polarization) to be provided by a corresponding horticultural light source over a time period, to emulate the desired evolving lighting conditions for meeting desired lighting requirements. Hence, each one of the lighting scenarios defines a plurality of lighting reference points, each having an associated reference illumination state to be achieved by the solid-state light emitters of the corresponding horticultural light source 22, at a corresponding reference moment of the scenario timeline. In an embodiment, transition illumination can also be provided between the reference illumination states.

The lamp profile acquisition module 32 is configured to acquire or access a reference profile 32a of a corresponding horticultural light source 22 including solid-state light emitters. The reference profile 32a of the corresponding horticultural light source 22 includes sets of reference control parameters of the horticultural light source 22, for producing the corresponding reference illumination states associated to a corresponding one of the plurality of lighting reference points of the lighting scenario (and, in an embodiment, the transition illumination between the reference illumination states).

In an embodiment, the lamp profile acquisition module 32 is in data communication with a hardware profile module 26 of the horticultural light source 22 including data relative to different design aspects of the horticultural light source 22. For example and without being limitative, in an embodiment, the data relative to different design aspects of the horticultural light source 22 can include, the number of LED channels physically populated on the horticultural light source 22, the identity of each LED of the horticultural light source 22, data relative to the temperature sensors of the horticultural light source 22 (which will be described in more details below), etc. Hence, the lamp profile acquisition module 32 acquires from the hardware profile module 26 of the horticultural light source 22 of the system 20, the reference profile 32a. One skilled in the art will understand that the reference profile 32a is specific to each horticultural light source 22 (i.e. each type or model of horticultural light source).

One skilled in the art will also understand that, in an embodiment (not shown), the reference profile 32a of a corresponding horticultural light source 22 can be initially acquired from the hardware profile module 26 of the horticultural light source 22 and stored in a data source. Hence, in this alternative embodiment (not shown), the lamp profile acquisition module 32 can be in data communication with the data source storing the reference profile of the corresponding horticultural light source 22 of the system 20, to acquire the reference profile 32a therefrom.

In an embodiment, the lamp profile acquisition module 32 is further configured to generate virtual illumination instructions 32b of the horticultural light source 22 which are representative of each corresponding virtual lighting scenario, based on the acquired reference profile 32a and the specific lighting scenario. As will be described in more details below, the virtual illumination instructions 32a of the horticultural light source 22 are used to perform the simulations of the corresponding virtual lighting scenarios, as they define the virtual operation of the associated horticultural light source 22, during the course of the execution of the lighting scenario.

In an embodiment, the virtual illumination instructions 32b of the horticultural light source 22 can be files which can include, for example and without being limitative, virtual control parameters of the horticultural light source 22 and associated computer readable instructions for simulating, driving or controlling the horticultural light source 22 according to the virtual control parameters, in order to provide the desired simulation of the generation of light having the optical characteristics that vary or evolve over the given time period. In some embodiments, the virtual illumination instructions 32b can be provided in a dataset including a plurality of sets or control parameters for the horticultural light source 22. The dataset can be stored as a relational database and can have a database format commonly used in the art, such as Domino, SQL, SCSV, Office 365, or the like. The dataset can comprise textual information, numeral information, time information, date information, image information, and any combinations thereof.

One skilled in the art will readily understand that, in an alternative embodiment (not shown), a distinct module could be provided to generate the virtual illumination instructions 32b of the horticultural light source 22 which are representative of each corresponding virtual lighting scenario, based on the acquired reference profile and the specific lighting scenario.

The scenario simulation module 40 is in data communication with the input module 30 and the lamp profile acquisition module 32 and uses the data therefrom to manage and/or execute one or multiple simulations of the virtual lighting scenarios for a given time period. As will be described in more details below, in an embodiment, the scenario simulation module 40 can therefore generate simulation results which can be used to determine or select at least one lighting scenario adapted or optimized for specific crops/plants, contexts, environments and/or parameters.

Figure 2:
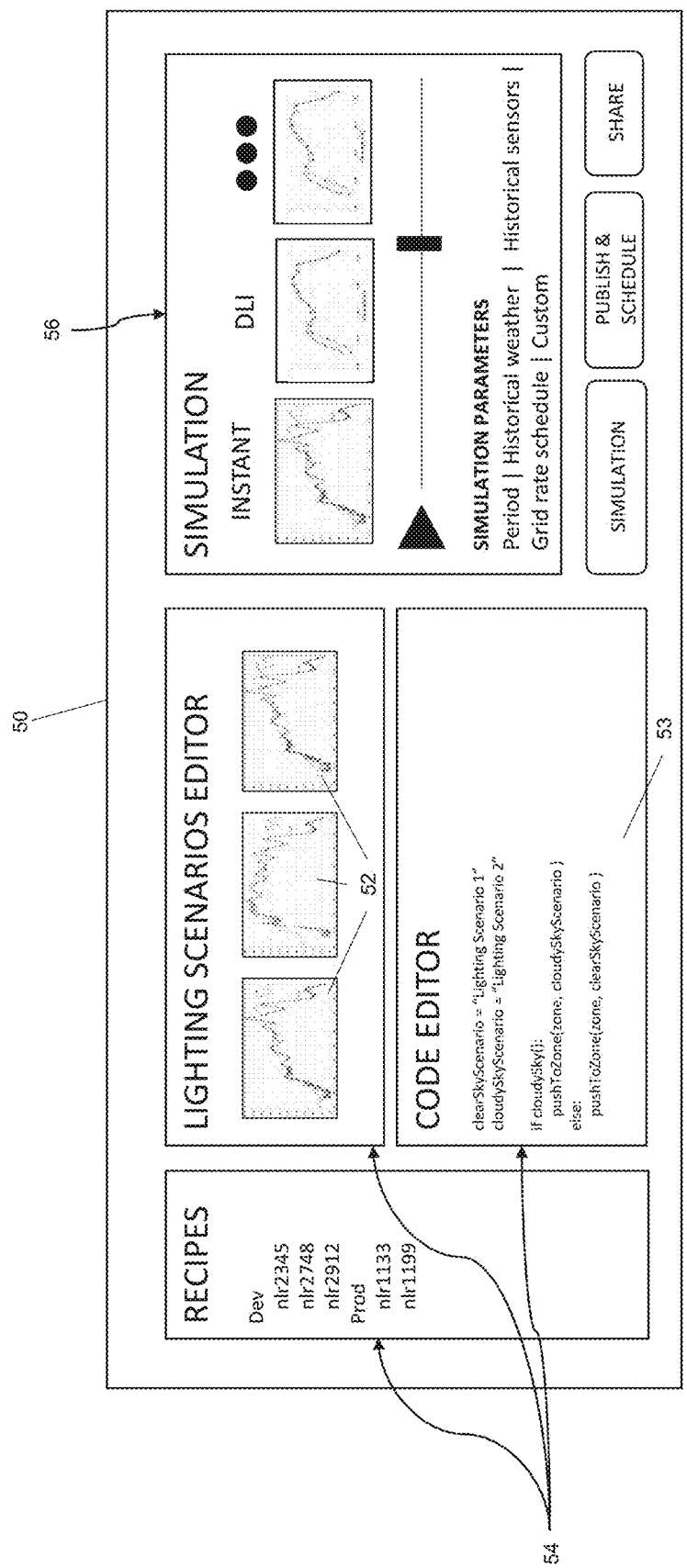
FIG. 2 is a schematic representation of a graphical user interface of the system for simulating and implementing horticultural lighting scenarios of FIG. 1, in accordance with an embodiment.

Referring to FIGS. 1 and 2, in an embodiment, the scenario simulation module 40 is also in data communication with a graphical user interface 50, displayed on a display screen of the computing device 16. One skilled in the art will understand that, in alternative embodiments (not shown), the graphical user interface 50 could be displayed on the display screen of a different computing device than the computing device 16 hosting components of the present system 20. For example and without being limitative, in an embodiment, the graphical user interface 50 could be part of a web-based application which can be accessed and displayed using a computing device connected to the Internet or the like.

In an embodiment, the scenario simulation module 40 can transmit data regarding the simulation parameters and the lighting scenarios data to the graphical user interface 50. This allows the display of the available simulation parameters thereon (i.e. the available datasets regarding weather, sensors and/or grid rate schedule) for user selection prior to the launch of the simulation. This also allows the display of lighting scenarios data in the graphical user interface 50 for selection, creation, edition, re-ordering, duplication and/or replication of the virtual lighting scenarios, as further detailed below. One skilled in the art will understand that, in an alternative embodiment (not shown), the data regarding the simulation parameters and/or the lighting scenarios could also be transmitted directly from the input module 30 or the corresponding data sources 28, 29, to the graphical user interface 50.

In the embodiment shown in FIG. 2, the graphical user interface 50 can includes visual representations of virtual lighting scenarios. For example and without being limitative, the visual representations of the virtual lighting scenarios can include illumination charts 52 defining graphical representation of the optical characteristics varying or evolving over the given time period and/or code representation 53 presenting the logic programming defining the virtual lighting scenarios.

It will be understood that the virtual lighting scenario can be a preprogrammed virtual lighting scenario received or acquired by the input module 30 and communicated to the graphical user interface 50, in response to a user selection from the graphical user interface 50. In an embodiment, the graphical user interface 50 includes scenario editing sections 54, which can include displays and/or controls allowing user inputs for selection, creation, editing, re-ordering, duplication and/or replication of virtual lighting scenarios targeting a photoperiod duration and meeting the lighting requirements. For example, the user inputs can be provided via input devices 51 (e.g. mouse, keyboard, joystick, touch-screen, track pads, etc.) coupled to the associated computing device 16. One skilled in the art will understand that the creation and/or edition of the virtual lighting scenarios can be performed using graphical control elements of the graphical user interface 50 for varying parameters of the virtual lighting scenario (e.g. buttons, sliders, menus, toolbars, textboxes, etc.) and/or through programming steps, such as, for example and without being limitative, logic programming. The user inputs can also include, for example and without being limitative, code, computer-readable instructions or any other computer programming steps or sub-steps The input can be manually provided, automatically provided or semi-automatically provided.

The graphical user interface 50 can also provide controls for allowing the selected, created, edited, re-ordered, duplicated and/or replicated virtual lighting scenarios to be saved in a data and/or exported. Hence, the graphical user interface 50 can offer an environment to a user for programming the virtual lighting scenarios.

In view of the above, it will be understood that, in an embodiment, the graphical user interface 50 can receive a preprogrammed virtual lighting scenario as an input, for example following a user selection using the graphical user interface 50. However, in alternative embodiments, users can rather use the environment of the graphical user interface 50 for programming (i.e. creating, editing, re-ordering, duplicating and/or replicating) one or more virtual lighting scenarios.

The graphical user interface 50 also includes a virtual simulation section 56, allowing a user to manage, launch and control one or multiple simulations of the execution of the virtual lighting scenarios for a specified time period. Hence, the virtual simulation section 56 includes graphical control elements (e.g. buttons, sliders, menus, toolbars, textboxes, etc.) for selecting the simulation parameters (weather parameters, sensor parameters, grid rate schedule, etc.), and for launching and controlling the evolution of the simulation, using input devices 51 coupled to the associated computing device 16.

The virtual simulation section 56 also includes simulation results being displayed as the simulation progresses over the simulated time period. As will be described in more details below, in an embodiment, the simulation results correspond to selected integral indicators being determined or estimated by the scenario simulation module 40, for the specific simulated operation of the horticultural light source 22, as defined by the virtual illumination instructions of the horticultural light source 22 corresponding to the virtual lighting scenario, and the selected simulation parameters.

In order to perform the above-mentioned virtual simulations of the virtual lighting scenarios, the scenario simulation module 40 therefore receives data from the graphical user interface 50 regarding the one or more virtual lighting scenario to be simulated and the simulation parameters selected for the simulation. In an embodiment, the scenario simulation module 40 is configured to transmit the virtual lighting scenario(s) to be simulated to the lamp profile acquisition module 32 and acquire therefrom the virtual illumination instructions of the horticultural light source 22 for the corresponding lighting scenario(s). In an embodiment, the scenario simulation module 40 can further acquire the complete datasets defining the simulation parameters (i.e. the historical weather dataset including the weather information over the selected time period, the historical sensor datasets including environmental information from the sensors over the selected time period, and the historical grid rates schedule pattern dataset including grid rates over the selected time period) via the input module 30, or use previously received data in that regard.

The scenario simulation module 40 is configured to simulate the execution of the virtual illumination instructions representative of the selected virtual lighting scenario for the selected time period of the simulation, using the corresponding datasets defining the simulation parameters, and to generate the corresponding simulation results to be displayed on the graphical user interface 50.

In an embodiment, this is performed by determining or estimating the integral indicators resulting from the execution of the virtual illumination instructions on the horticultural light source 22. The estimation of the integral indicators can be obtained by estimating a plurality of successive instantaneous indicators, based on a priori knowledge, computation, empirical data, theoretical model, calibration data and any combinations thereof, for the specific simulation parameters. The instantaneous indicators (or the value representing a corresponding instantaneous indicator) can be stored on a data source or a memory. It should be noted that the instantaneous indicators can be temporarily or permanently saved. The integral indicators can then be determined or estimated by the scenario simulation module 40, based on the collection or accumulation of the plurality of successive estimated instantaneous indicators.

In an embodiment, the scenario simulation module 40 is therefore configured to compute the instantaneous indicators associated with the previously acquired virtual illumination instructions representative of the selected virtual lighting scenario. One skilled in the art will understand that the virtual illumination instructions can include, for example and without being limitative a virtual definition of the:

Relation between LEDs modulation and power consumption;
Relation between LEDs modulation and generated wavelengths;
Relation between LEDs modulation and generated irradiance; and
Relation between LEDs modulation and generated heat.

In an embodiment, the scenario simulation module 40 can compute the instantaneous indicators and collect (i.e., store or accumulate) the instantaneous indicators in a time series database. Alternatively, the instantaneous indicators can be collected as aggregates. It should be noted that computing the instantaneous indicators may be achieved using lamp modelling method(s).

In an embodiment (not shown), the scenario simulation module 40 can be configured to receive data relative to additional integral indicators from an integral indicator plugin framework which can be used to define new integral indicators to be determined or estimated by the scenario simulation module 40, during a simulation.

In an embodiment the results of the simulation can be used to determine how a virtual lighting scenario should be edited or modified to be better adapted/optimized for specific crops/plants, contexts, environments and/or parameters and the virtual scenario can be edited or modified using the graphical user interface 50 to generate updated scenarios, which can in turn also be simulated in accordance with the above description.

Once the simulations are completed, the results of the simulations can be used to determine or select, for example using the graphical user interface 50, at least one lighting scenario for which the results of the simulation of the associated virtual lighting scenario show that at least one lighting scenario is adapted/optimized for specific crops/plants, contexts, environments and/or parameters. In other words, in an embodiment, the graphical user interface 50 is used to provide input defining a selection relative to the selected horticultural lighting scenario, based on the simulation results being displayed on the graphical user interface 50. The selected horticultural lighting scenario in accordance with the selection can be transmitted to the output module 60.

Referring again to FIG. 1, in an embodiment, the output module 60 is configured to receive a lighting scenario corresponding to a virtual lighting scenario corresponding selected based on the simulation results and output the illumination instructions 60*a* representative of the corresponding lighting scenario to be performed by the horticultural light source 22. The output module 60 can output the illumination instructions 60*a* as a batch or a stream of illumination instructions sent towards the horticultural light source 22.

In an embodiment, the illumination instructions 60*a* are received as input by the horticultural light source 22, which is subsequently operated accordingly to produce the desired natural light illumination of the crop or plants. One skilled in the art will understand that, in an embodiment, the output module 60 can be configured to transmit the illumination instructions to a data source such as, for example and without being limitative, a published lighting scenario database 62 to which the horticultural light source 22 is connected to subsequently acquire the illumination instructions and perform the illumination in accordance thereto.

Method for Simulating and Implementing Horticultural Lighting Scenarios

Figure 3:
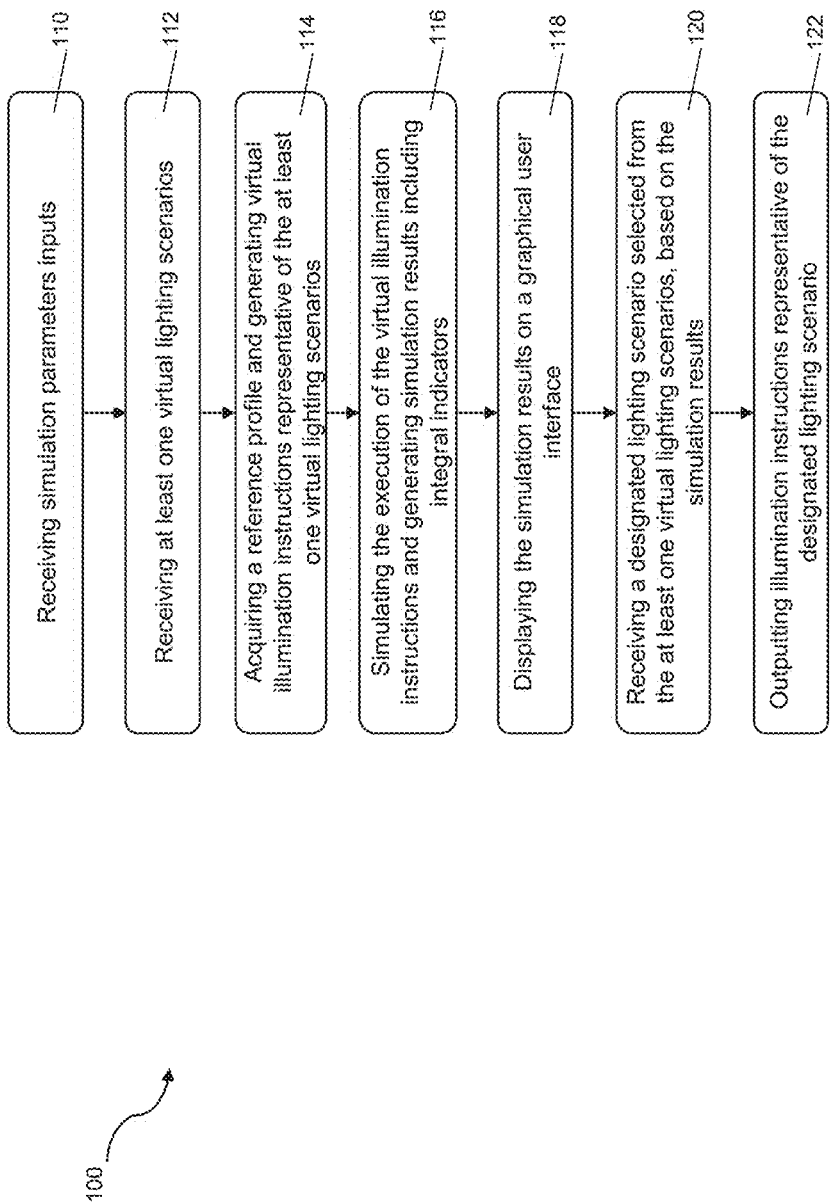
FIG. 3 is a flowchart showing the steps of the method for simulating and implementing horticultural lighting scenarios, in accordance with an embodiment.

Now turning to FIG. 3, there is shown a method 100 for simulating and implementing horticultural lighting scenarios for driving a horticultural light source in accordance with illumination instructions, in accordance with an embodiment.

One skilled in the art will understand that the method described herein can include steps for implementing in the present method for simulating and implementing horticultural lighting scenarios for driving a horticultural light source in accordance with illumination instructions all of above-mentioned characteristics of the corresponding system. Hence, it will be understood that even though steps corresponding to above-described corresponding system are not all described in the present description, these steps form part of the present method.

The method 100 includes a first general step 110 of receiving simulation parameter inputs. Once again, the simulation parameter input can be representative of a past illumination sequence of a crop or plant. As indicated above, the simulation parameters can include historical external information, including historical weather parameters representative of past illumination sequences, historical sensor parameters including environmental information (e.g. temperature, humidity, lighting, $CO_2$, etc.) obtained from sensors and representative of past illumination sequences and historical grid rates schedule pattern parameters representative of past illumination sequences. In an embodiment, each simulation parameter can be contained in corresponding datasets. In an embodiment, the simulation parameter can be received following a user selection of the simulation parameters to be used, on a graphical user interface.

The method also includes a step 112 of receiving at least one virtual lighting scenario. As described above, the at least one virtual lighting scenario can be a preprogrammed lighting scenario received from a lighting scenario data source. Alternatively, the at least one virtual lighting scenario can be a lighting scenario created, edited, re-ordered, duplicated and/or replicated by a user through the graphical user interface which provides an environment to the user for programming the lighting scenarios. In some embodiments, the method can be adapted to receive one or more scenarios, recipes, recipe bundles, or any types of lighting sequence as inputs.

In an embodiment, the method includes the further step 114 of acquiring a reference profile of a horticultural light source and determining virtual illumination instructions of the horticultural light source for at least one virtual lighting scenarios being received. In an embodiment, acquiring the reference profile for the horticultural light can be performed by acquiring sets of reference control parameters of the horticultural light source for producing reference illumination states each associated to a corresponding one of a plurality of lighting reference points of the horticultural lighting scenario.

The method also includes the step 116 of simulating the execution of at least one virtual lighting scenario, for the corresponding horticultural light source, in accordance with the simulation parameters and for a specific time period. In an embodiment, this step includes simulating the execution of the virtual illumination instructions representative of the selected virtual lighting scenario for the specific time period to generate the corresponding simulation results to be displayed on the graphical user interface, by determining or estimating the integral indicators resulting from the execution of the virtual illumination instructions on the horticultural light source. As previously mentioned, the estimation of the integral indicators can be obtained by computing a plurality of successive instantaneous indicators and using the collection or accumulation of the plurality of successive estimated instantaneous indicators to compute the integral indicators. In an embodiment, the plurality of successive instantaneous indicators are computed using at least one lamp modelling method. Once again, the plurality of successive estimated instantaneous indicators can be collected in a time series database. Alternatively, the instantaneous indicators can be collected as aggregates.

In an embodiment, the method can include receiving data relative to additional integral indicators from an integral indicator plugin framework defining new integral indicators to be determined or estimated during a simulation.

The method can also include the step 118 of displaying simulation results from the simulation of the execution of at least one virtual lighting scenario on the graphical user interface and receiving a designated lighting scenario selected from the at least one virtual lighting scenarios, based on the simulation results. In an embodiment, this entails a prior step of transmitting the simulation results to the graphical user interface, before the display of the simulation results thereon.

The method includes the further step 120 of outputting illumination instructions representative of the designated lighting scenario. Ina an embodiment, this entails receiving input from the graphical user interface defining the designated horticultural lighting scenario selected from the at least one virtual lighting scenarios, based on the simulation results.

In an embodiment, the method can finally include the step of driving the horticultural light source according to the selected lighting scenario 122. As mentioned above, in some embodiments, the present method and system can be used to drive one or more horticultural light source.

In accordance with another aspect of the present description, there is provided a non-transitory computer readable storage medium having stored thereon computer executable instructions that, when executed by a processor, cause the processor to perform the method that has been previously described. The non-transitory computer storage medium can be integrated to the systems or assemblies that have been described in the present description. The non-transitory computer storage medium could otherwise be operatively connected with the systems or assemblies. In the present description, the terms "computer readable storage medium" and "computer readable memory" are intended to refer to a non-transitory and tangible computer product that can store and communicate executable instructions for the implementation of various steps of the method disclosed herein. The computer readable memory can be any computer data storage device or assembly of such devices, including random-access memory (RAM), dynamic RAM, read-only memory (ROM), magnetic storage devices such as hard disk drives, solid state drives, floppy disks and magnetic tape, optical storage devices such as compact discs (CDs or CDROMs), digital video discs (DVD) and Blu-Ray™ discs; flash drive memory, and/or other non-transitory memory technologies. A plurality of such storage devices may be provided, as can be understood by those skilled in the art. The computer readable memory may be associated with, coupled to, or included in a computer or processor configured to execute instructions contained in a computer program stored in the computer readable memory and relating to various functions associated with the computer.

Working Examples of the Method for Simulating and Implementing Horticultural Lighting Scenarios First Example For example and without being limitative, in a context where the above-described system is associated with lighting equipment providing lighting in a greenhouse, an operator may want to optimize existing lighting scenario for obtaining additional savings regarding electrical power consumption.

For example, the user may want to optimize a current lighting scenario which has been in use for some time and generates the desired plant productivity as well as targeted plants qualities, such as size, color, nutriment levels, etc.

For instance, the crop for which the lighting scenario has been developed may respond better under known color ratios ranges, notably the blue to red ratio and blue to far-red daily ratio and require a certain amount of daily light for optimal growth. The current published lighting scenario may therefore achieve those characteristics.

However, the user may desire to lower greenhouse energy consumption, with for example and without being limitative, a target reduction of 5%.

It is understood that lamp electricity consumption varies depending on the spectral power distribution (SPD) rendered by the lamp LEDs and controllers instantaneously and can be measured by an integral at the end of the photoperiod.

In view of the above, an end user of a lighting system implementing the current published lighting scenario may wish to experiment with variations of the current lighting scenario to find a photoperiod light scenario close to the current one, in term of daily color ratios and daily light, but however resulting in a reduced overall power consumption.

Hence, the above-described system for simulating and implementing horticultural lighting scenarios allows the user to initially retrieve the previously saved published lighting scenario, using the scenario editing sections 54 of the graphical user interface 50.

The system also allows the user to familiarize itself with the characteristics of the published lighting scenario by executing simulations with various simulation parameters situations, inspecting the resulting lighting scenario and integral indicators using the virtual simulation section 56 of the graphical user interface 50 and all underlying components of the system allowing the execution of the simulations and the display of the results on the graphical user interface 50.

For example and without being limitative, the blue to red and blue to far-red daily color ratio integral, the power consumption integral associated with each wavelength as well as the light integral to determine the photosynthetic photon flux (PPF) or the photosynthetic photon flux density (PPFD) can be monitored using the system.

One skilled in the art will therefore understand that system also allows the end user to edit the virtual lighting scenario (i.e. modify certain aspects of the virtual lighting scenario, such as for instance the wavelength intensities during certain period of the day), using the scenario editing sections 54, and perform further simulations using the virtual simulation section 56, while monitoring the same set of integral indicators.

Following the executions of the simulations, the system allows the user to select one or more promising virtual lighting scenarios, for which the simulations show that the results are optimized for the selected simulation parameters.

The graphical user interface 50 and output module 60 of the system can subsequently allow transmission of the illumination instructions to the horticultural light source 22 and implementation of the newly developed lighting scenarios on the horticultural light source 22.

Second Example

For example and without being limitative, in a context where the above-described system is associated with lighting equipment providing lighting in a greenhouse, an operator may want to develop a lighting scenario for certain periods of the year that are, for example and without being limitative, known for extreme alternance of cloudy and clear sky.

For instance, during that period of the year, the extreme lighting variations resulting from the alternance of cloudy and clear sky can make it challenging to reach stable predictable daily light integral as measured in photosynthetic photon flux (PPF) or the photosynthetic photon flux density (PPFD) and required by the crop light for optimal growth.

For the simulation, the system can have access to historical daily cloud patterns data which can be used as simulation parameters. For subsequent implementation in the greenhouse, the system can also have access to near real-time cloud density forecast from the national weather service and the this data can be used to make real-time adjustments to the lighting patterns.

Hence, the scenario editing sections 54 of the graphical user interface 50 allows the user to develop a set of illumination scenarios. Each lighting scenario can be designed to provide levels of lights that are designed to compensate the natural illumination levels obfuscated by the different cloud density levels.

With the specific objective of achieving a consistent daily light integral, programming instructions can therefore be implemented in the lighting scenario, using the system, to receive the real-time cloud density forecast from the national weather service and select the proper illumination scenario.

The system subsequently allows execution of simulations using the historical daily cloud patterns data, inspection of the resulting lighting scenario and integral indicators using the virtual simulation section 56 of the graphical user interface 50 and all underlying components of the system allowing the execution of the simulations and the display of the results on the graphical user interface 50.

For example and without being limitative, close monitoring of the light integral can be performed to determine the photosynthetic photon flux (PPF) or the photosynthetic photon flux density (PPFD).

Following the executions of the simulations, the system allows selection of one or more promising virtual lighting scenarios, for which the simulations show that the results are optimized for the selected simulation parameters.

The graphical user interface 50 and output module 60 of the system can subsequently allow transmission of the illumination instructions to the horticultural light source 22 and implementation of the newly developed lighting scenarios on the horticultural light source 22.

Third Example

For example and without being limitative, in a context where the above-described system is associated with lighting equipment providing lighting in a greenhouse, an operator may want to develop a lighting scenario combining the best of experimental data obtained from previous experiments on a specific crop type.

It is known that plants demonstrate dynamic changes in molecular structures under fluctuating light conditions. Light has an important role in the absorption and utilization of nutrients in plants. Specific light quality, light intensity, and photoperiod impacts on nutrient uptake and utilization in horticultural crops and has an impact on crop productivity and increasing fertilizer use efficiency.

For instance, an operator can have previously performed a certain number of growth experiments where specific plant nutriments have been provided to the crop at specific time of day in synchronization with light color treatments favoring absorption of those nutriments. The details of those experiments regarding the strategy used, the objectives, the nutriments and the light treatment timelines can have been saved, along with the results thereof, including quantitative and qualitative indicators documenting the experiments outcome and readings.

A user can therefore wish to develop a self-steering light recipe capable of using the data obtained from the past experimentations to make real-time decisions about when to provide nutriments and when to apply specific light treatments to optimize the absorption.

Furthermore, in this example, the user can have developed an integral indicator plugin component that estimates the nutriments absorption for a range of nutriments during a given period. The user can therefore import the developed plugin component to the scenario simulation module 40, using the integral indicator plugin framework, and use the scenario simulation module 40 to display nutriment indicators computed for the simulation periods.

Hence, the scenario editing sections 54 of the graphical user interface 50, allows the user to implement a lighting scenario including programming instruction that retrieves data from the previous experimentation data and use it to make decisions about the timing and types of light treatments for optimizing the introduction of nutriments. The programming instruction in the lighting scenario can therefore be provided to overlay the timing and types of light treatments over a baseline lighting scenario.

With the specific objective of achieving target absorption levels integrals for a set of nutriments, the scenario simulation module 40 of the system 20 allows execution of simulations using the baseline lighting scenario and the programming instruction providing the timing and types of light treatments based on the past experimentations data. The system also allows monitoring of the resulting lighting scenario and integral indicators using the virtual simulation section 56 of the graphical user interface 50 and all underlying components of the system 20 allowing the execution of the simulations and the display of the results on the graphical user interface 50.

In that configuration, the custom developed target absorption levels integrals are computed by the plugin component which is transparently invoked by the scenario simulation module 40. The plugin component can be reused with other lighting scenario implementations where nutriment absorption levels are of interest.

The graphical user interface 50 and output module 60 of the system can subsequently allow transmission of the illumination instructions to the horticultural light source 22 and implementation of the newly developed lighting scenarios on the horticultural light source 22.

Several alternative embodiments and examples have been described and illustrated herein. The embodiments of the invention described above are intended to be exemplary only. A person of ordinary skill in the art would appreciate the features of the individual embodiments, and the possible combinations and variations of the components. A person of ordinary skill in the art would further appreciate that any of the embodiments could be provided in any combination with the other embodiments disclosed herein. It is understood that the invention could be embodied in other specific forms without departing from the central characteristics thereof. The present examples and embodiments, therefore, are to be considered in all respects as illustrative and not restrictive, and the invention is not to be limited to the details given herein. Accordingly, while the specific embodiments have been illustrated and described, numerous modifications come to mind. The scope of the invention is therefore intended to be limited solely by the scope of the appended claims.

The invention claimed is:

1. A system for simulating and implementing horticultural lighting scenarios for driving a horticultural light source in accordance with illumination instructions, the system comprising:
   an input module receiving simulation parameters;
   a graphical user interface configured to allow at least one of selecting, creating, editing, re-ordering, duplicating and replicating at least one virtual lighting scenario being a virtual representation of a horticultural lighting scenario;
   a lamp profile acquisition module acquiring a reference profile of the horticultural light source, the lamp profile acquisition module being further configured to generate virtual illumination instructions of the horticultural light source for the at least one virtual lighting scenario;
   a scenario simulation module simulating the execution of the at least one virtual lighting scenario, for the horticultural light source, in accordance with the simulation parameters and for a specific time period, the scenario simulation module being configured to simulate the execution of the virtual illumination instructions representative of the at least one virtual lighting scenario for the specific time period and to generate therefrom simulation results including integral indicators and being displayable on the graphical user interface; and
   an output module receiving the horticultural lighting scenario corresponding to one of the at least one lighting scenario selected based on the simulation results and outputting the illumination instructions representative of the one of the at least one lighting scenario.

2. The system of claim 1, wherein the reference profile of the horticultural light source includes sets of reference control parameters of the horticultural light source for producing reference illumination states each associated to a corresponding one of a plurality of lighting reference points of the horticultural lighting scenario.

3. The system of claim 1, wherein the scenario simulation module is configured to perform one of determination and estimation of the integral indicators resulting from the execution of the virtual illumination instructions on the horticultural light source.

4. The system of claim 3, wherein the scenario simulation module is configured to perform the one of the determination and estimation of the integral indicators by computing a plurality of successive instantaneous indicators for the virtual illumination instructions representative of the virtual lighting scenario specific simulation parameters and subsequently collecting the plurality of successive estimated instantaneous indicators.

5. The system of claim 4, wherein the scenario simulation module is configured to perform computing of the plurality of successive instantaneous indicators using at least one lamp modelling method.

6. The system of claim 4, wherein the scenario simulation module is configured to collect the plurality of instantaneous indicators in a time series database or as aggregates.

7. The system of claim 1, wherein the scenario simulation module is configured to receive data relative to additional integral indicators from an integral indicator plugin framework defining new integral indicators to be determined or estimated by the scenario simulation module during a simulation.

8. The system of claim 1, wherein the scenario simulation module is configured to transmit the simulation results to the graphical user interface and the graphical user interface is configured to display the simulation results thereon, the graphical user interface being further configured to provide input defining a selection relative to the selected horticultural lighting scenario, based on the simulation results being displayed on the graphical user interface and to transmit the selected horticultural lighting scenario in accordance with the selection to the output module.

9. The system of claim 1, further comprising the horticultural light source being configured to be driven according to the horticultural lighting scenario corresponding to one of the at least one lighting scenario selected based on the simulation results.

10. A method for simulating and implementing horticultural lighting scenarios for driving a horticultural light source in accordance with illumination instructions, the method comprising the steps of:
   receiving simulation parameters inputs;
   receiving at least one virtual lighting scenario being a virtual representation of a horticultural lighting scenario;
   acquiring a reference profile for the horticultural light source and generating virtual illumination instructions of the horticultural light source, for the at least one virtual lighting scenarios;
   simulating the execution of the at least one virtual lighting scenario, for the horticultural light source, in accordance with the simulation parameters and for a specific time period, the simulation being performed by simulating the execution of the virtual illumination instructions representative of the at least one virtual lighting scenarios for the specific time period and generating therefrom simulation results including integral indicators;
   displaying the simulation results from the simulation of the execution of the at least one virtual lighting scenario on a graphical user interface and receiving a designated horticultural lighting scenario selected from the at least one virtual lighting scenarios, based on the simulation results; and outputting illumination instructions representative of the designated horticultural lighting scenario.

11. The method of claim 10, wherein the step of acquiring the reference profile for the horticultural light source includes acquiring sets of reference control parameters of the horticultural light source for producing reference illumination states each associated to a corresponding one of a plurality of lighting reference points of the horticultural lighting scenario.

12. The method of claim 10, wherein the step of simulating the execution of the at least one virtual lighting scenario includes performing one of determination and estimation of the integral indicators resulting from the execution of the virtual illumination instructions on the horticultural light source.

13. The method of claim 12, wherein performing the one of the determination and estimation of the integral indicators includes computing a plurality of successive instantaneous indicators for the virtual illumination instructions representative of the virtual lighting scenario specific simulation parameters and subsequently collecting the plurality of successive estimated instantaneous indicators.

14. The method of claim 13, wherein computing of the plurality of successive instantaneous indicators includes computing the plurality of successive instantaneous indicators using at least one lamp modelling method.

15. The method of claim 13, wherein collecting the plurality of successive estimated instantaneous indicators includes collecting the plurality of successive estimated instantaneous indicators in a time series database or as aggregates.

16. The method of claim 10, further comprising the step of receiving data relative to additional integral indicators from an integral indicator plugin framework defining new integral indicators to be determined or estimated during a simulation.

17. The method of claim 10, further comprising the steps of:
transmitting the simulation results to the graphical user interface prior to the display of the simulation results thereon; and
receiving input from the graphical user interface defining the designated horticultural lighting scenario selected from the at least one virtual lighting scenarios, based on the simulation results.

18. The method of claim 10, wherein the step of receiving the least one virtual lighting scenario includes one of receiving a preprogrammed lighting scenario from a lighting scenario data source and receiving from the user interface a virtual lighting scenario created, edited, re-ordered, duplicated or replicated using the graphical user interface.

19. The method of claim 10, further comprising the step of driving the horticultural light source according to the selected lighting scenario.

20. A non-transitory computer readable storage medium having stored thereon computer executable instructions that, when executed by a processor, cause the processor to perform the steps of a method for simulating and implementing horticultural lighting scenarios for driving a horticultural light source in accordance with illumination instructions method comprising:
receiving simulation parameters inputs;
receiving at least one virtual lighting scenario being a virtual representation of a horticultural lighting scenario;
acquiring a reference profile for the horticultural light source and generating virtual illumination instructions of the horticultural light source, for the at least one virtual lighting scenarios;
simulating the execution of the at least one virtual lighting scenario, for the horticultural light source, in accordance with the simulation parameters and for a specific time period, the simulation being performed by simulating the execution of the virtual illumination instructions representative of the at least one virtual lighting scenarios for the specific time period and generating therefrom simulation results including integral indicators;
displaying the simulation results from the simulation of the execution of the at least one virtual lighting scenario on a graphical user interface and receiving a designated horticultural lighting scenario selected from the at least one virtual lighting scenarios, based on the simulation results; and
outputting illumination instructions representative of the designated horticultural lighting scenario.

* * * * *